(12) United States Patent
Furuta

(10) Patent No.: US 8,685,839 B2
(45) Date of Patent: Apr. 1, 2014

(54) WORKPIECE DIVIDING METHOD

(75) Inventor: Kenji Furuta, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/253,563

(22) Filed: Oct. 5, 2011

(65) Prior Publication Data

US 2012/0088354 A1    Apr. 12, 2012

(30) Foreign Application Priority Data

Oct. 7, 2010  (JP) ................................. 2010-227851

(51) Int. Cl.
   *H01L 21/78*      (2006.01)
(52) U.S. Cl.
   USPC .................................. 438/463; 257/E21.599
(58) Field of Classification Search
   USPC ......................................................... 438/463
   See application file for complete search history.

(56) References Cited

U.S. PATENT DOCUMENTS

| 7,350,446 | B2 * | 4/2008 | Nagai | 83/581 |
| 2005/0118939 | A1 * | 6/2005 | Duescher | 451/527 |
| 2008/0268619 | A1 * | 10/2008 | Nakamura | 438/463 |

FOREIGN PATENT DOCUMENTS

JP     2002-192370     7/2002

* cited by examiner

*Primary Examiner* — Telly Green
*Assistant Examiner* — Damian A Hillman
(74) *Attorney, Agent, or Firm* — Greer Burns & Crain Ltd.

(57) ABSTRACT

In a semiconductor wafer with a supporting tape attached to the back side of the wafer, a coating member having a refractive index close to that of the supporting tape is formed on a pear-skin surface of the supporting tape to thereby planarize the pear-skin surface. Thereafter, a pulsed laser beam is applied from the upper side of the coating member to the semiconductor wafer in the condition where the focal point of the pulsed laser beam is set at a predetermined depth in the semiconductor wafer. Accordingly, the pulsed laser beam can be sufficiently focused inside the semiconductor wafer to thereby well form a modified layer inside the semiconductor wafer.

2 Claims, 9 Drawing Sheets

WORKPIECE DIVIDING METHOD

BACKGROUND OF THE INVENTION

1. Field of the Invention

The present invention relates to a workpiece dividing method for dividing a workpiece such as a semiconductor wafer.

2. Description of the Related Art

In a semiconductor device fabrication process, a plurality of crossing division lines called streets are formed on the front side of a workpiece such as a semiconductor wafer and an optical device wafer to thereby partition a plurality of regions where a plurality of circuits such as semiconductor devices and optical devices are respectively formed. The workpiece is cut along the division lines to divide the regions where the circuits are formed from each other, thus obtaining individual semiconductor chips. As a method of dividing the workpiece along the division lines, a laser processing method using a pulsed laser beam having a transmission wavelength to the workpiece is known (see Japanese Patent No. 3408805, for example).

In this laser processing method (dividing method), the pulsed laser beam having a transmission wavelength is applied to the workpiece from one side thereof along the division lines in the condition where the focal point of the pulsed laser beam is set inside the workpiece, thereby continuously forming a modified layer inside the workpiece along each division line. Thereafter, an external force is applied to the workpiece along the division lines where the modified layers are respectively formed to reduce the strength, thereby dividing the workpiece into semiconductor chips.

In the case of forming the modified layers in the method of dividing the workpiece into the semiconductor chips, there are the following cases. That is, (1) there is a case that the laser beam is required to be applied from the back side of the workpiece where the circuits are not formed, so as to form the modified layers in the workpiece along the streets having a small pitch. (2) It is difficult to handle the workpiece having the modified layers in its easily breakable condition and it is therefore desirable to avoid the step of replacing a tape attached to the workpiece after forming the modified layers. (3) In the step of picking up the semiconductor chips after dividing the workpiece, the front side of each semiconductor chip where the circuit is formed must be exposed. In consideration of the above cases, it is sometimes desired to apply the laser beam to the workpiece through a dicing tape attached to the back side of the workpiece, thus forming the modified layers in the workpiece.

SUMMARY OF THE INVENTION

However, from the viewpoint of a tape expanding step as one kind of the methods of applying an external force along the division lines or a handling step, there is a case that the surface of a base film constituting a supporting tape (dicing tape) (the surface opposite to the adhesive surface of the supporting tape) is formed as a pear-skin (an aventurine) surface in order to reduce a coefficient of friction. In this case, the refractive index of air for the laser beam is largely different from the refractive index of the supporting tape, so that incident light scatters at an uneven portion of the pear-skin surface. Accordingly, the laser beam cannot be sufficiently focused in the workpiece and the desired modified layers cannot therefore be formed in the workpiece.

It is therefore an object of the present invention to provide a workpiece dividing method which can accurately form the modified layers in the workpiece even when the laser beam is applied to the workpiece through the supporting tape having the pear-skin surface.

In accordance with an aspect of the present invention, there is provided a workpiece dividing method for dividing a workpiece having a plurality of division lines formed on the front side of said workpiece for partitioning a plurality of regions where a plurality of devices are respectively formed, wherein an adhesive tape having a pear-skin surface as an exposed surface is attached to the back side of said workpiece, said workpiece dividing method comprising a planarizing step of applying a liquid resin to said exposed surface of said adhesive tape and next curing said liquid resin to thereby planarize said exposed surface of said adhesive tape; a modified layer forming step of applying a laser beam having a transmission wavelength to said liquid resin, said adhesive tape, and said workpiece from the side of said exposed surface of said adhesive tape to said workpiece in the condition where the focal point of said laser beam is set at a predetermined depth in said workpiece after performing said planarizing step, thereby forming a plurality of modified layers in said workpiece along said division lines; and a dividing step of applying an external force to said workpiece after performing said modified layer forming step, thereby dividing said workpiece along said division lines as starting from said modified layers formed in said workpiece as a break start point.

According to the workpiece dividing method of the present invention, the following effect can be exhibited. Even when the laser beam is passed through the supporting tape having the pear-skin surface to enter the workpiece, the modified layers can be accurately formed at desired positions inside the workpiece, so that the workpiece can be reliably divided along the division lines.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

A workpiece dividing method according to a preferred embodiment of the present invention will now be described with reference to the drawings. The workpiece dividing method according to this preferred embodiment includes the steps of attaching a supporting tape as an adhesive tape to the back side of a workpiece as an object to be divided, next applying a pulsed laser beam to the workpiece from the back side thereof to thereby form modified layers in the workpiece, and next applying an external force to the workpiece having these modified layers where the strength is reduced to thereby divide the workpiece.

Prior to the description of the workpiece dividing method according to this preferred embodiment, a supporting structure for the workpiece by the supporting tape and an apparatus to be used in processing the workpiece will now be described.
(Supporting Structure for Workpiece)

Figure 1:
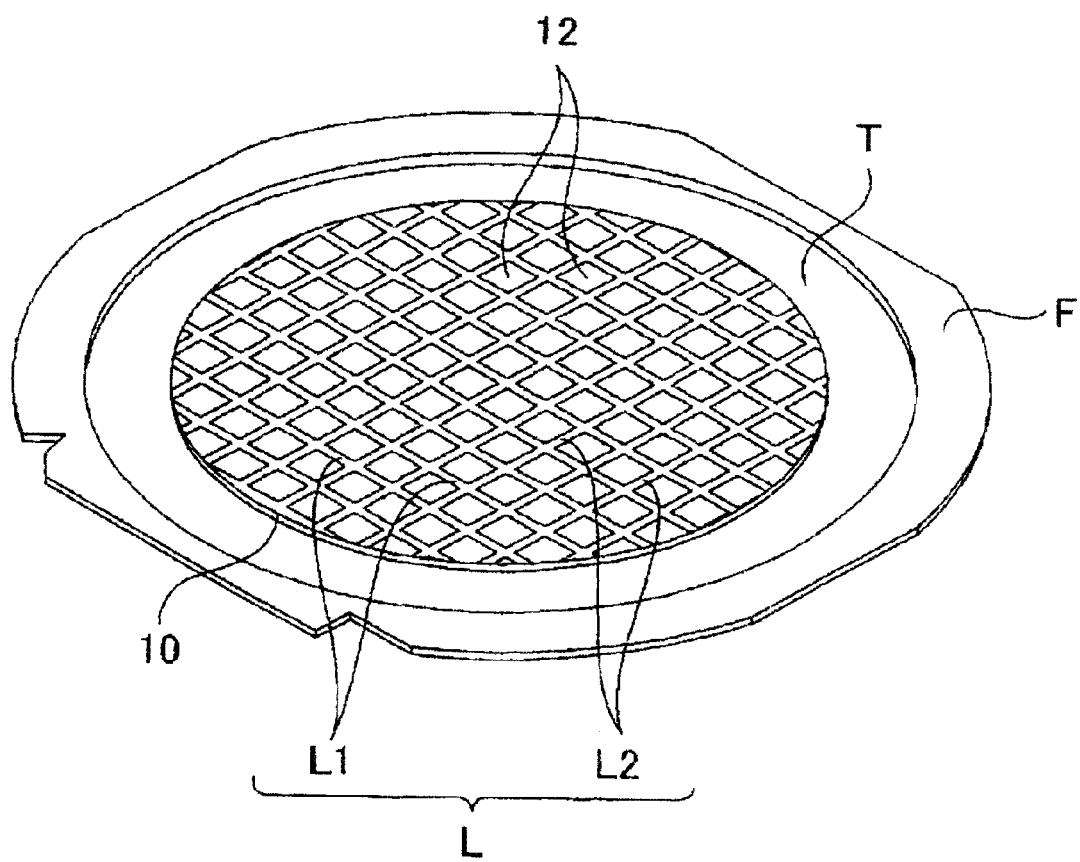
FIG. 1 is a perspective view of a semiconductor wafer in the condition where a supporting tape is attached to the semiconductor wafer in the workpiece dividing method according to a preferred embodiment of the present invention.

FIG. 1 is a perspective view of a semiconductor wafer 10 as an example of the workpiece in the condition where a supporting tape T is attached to the semiconductor wafer 10. As shown in FIG. 1, the semiconductor wafer 10 as an object to be divided in this preferred embodiment has a substantially circular shape. As shown in FIG. 1, the semiconductor wafer 10 is handled in the condition where it is supported through the supporting tape T to an annular frame F. More specifically, an outer circumferential portion of the supporting tape T is supported to the annular frame F so as to close an inner opening of the annular frame F. The supporting tape T has an adhesive surface T2 (see FIG. 6). The back side of the semiconductor wafer 10 (where devices 12 are not formed) is attached to the adhesive surface T2 of the supporting tape T in the condition where the front side of the semiconductor wafer 10 (where the devices 12 are formed) is exposed. As shown in FIG. 1, the front side of the semiconductor wafer 10 as the exposed surface to which the supporting tape T is not attached is partitioned into a plurality of rectangular regions by a plurality of crossing division lines L composed of first and second division lines L1 and L2 perpendicular to each other, and a plurality of devices 12 are formed in these plural rectangular regions, respectively.

The supporting tape T is formed from an expandable synthetic resin sheet such as a sheet of polyvinyl chloride or polyolefin. The refractive index of the supporting tape T for the wavelength (1064 nm) of a laser beam in this preferred embodiment is in the range of 1.4 to 1.7. Further, the other surface of the supporting tape T opposite to the adhesive surface T2 to which the semiconductor wafer 10 is attached is a pear-skin surface T1 providing a pear-skin texture, wherein the pear-skin surface T1 is formed with an uneven portion 11 as the pear-skin texture (see FIG. 6).

The workpiece in the present invention is not especially limited. Examples of the workpiece include a semiconductor wafer of silicon (Si), gallium arsenide (GaAs), etc., an adhesive member such as DAF (Die Attach Film) provided on the back side of a wafer for chip mounting, a semiconductor product package, an inorganic pear-skinerial substrate of ceramic, glass, sapphire ($Al_2O_3$), etc., various electronic parts such as an LCD driver, and various work pear-skinerials required to achieve a processing positional accuracy on the order of micrometers.

Figure 2:
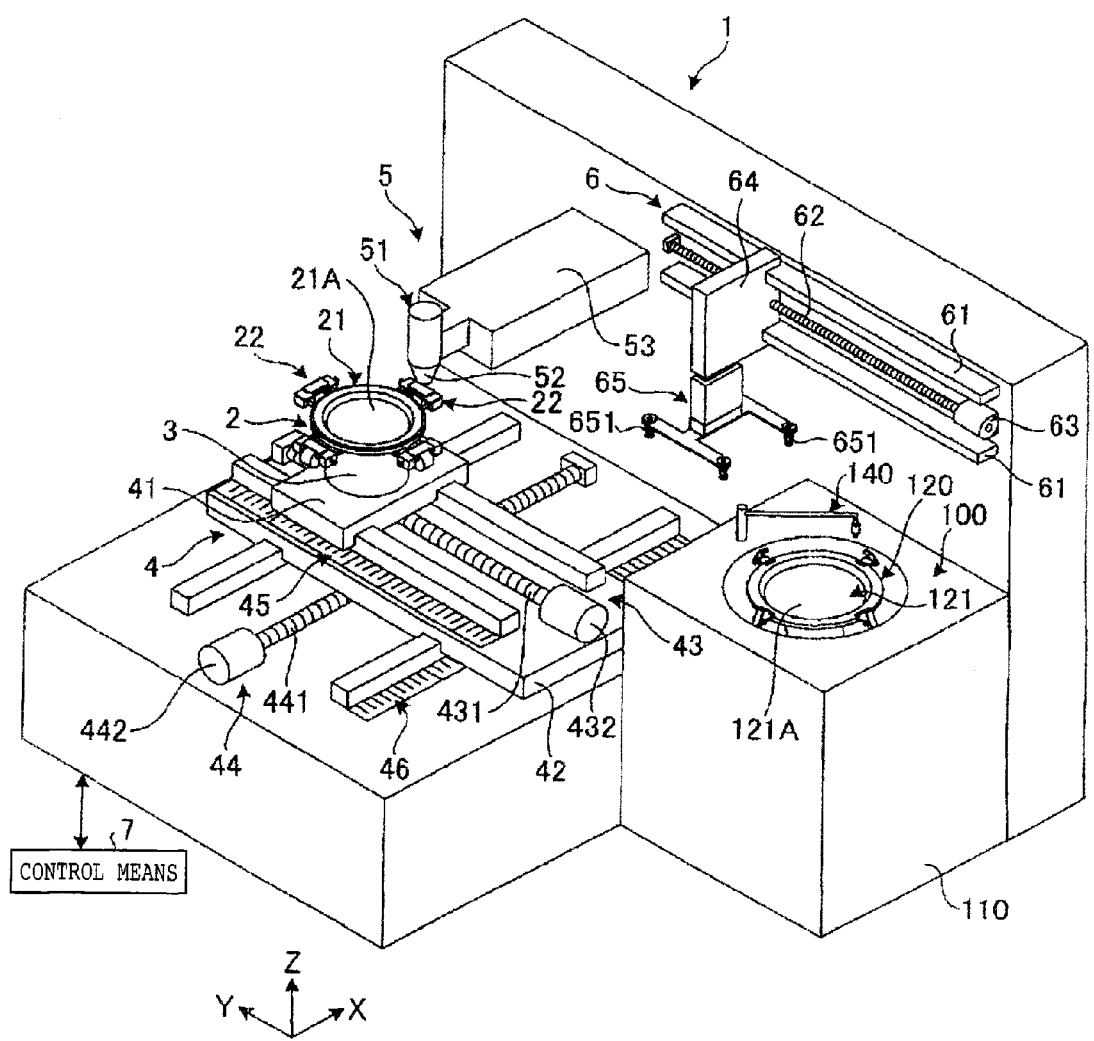
FIG. 2 is a perspective view showing the configuration of an essential part of a laser processing apparatus for forming modified layers in the semiconductor wafer.

FIG. 2 shows a laser processing apparatus 1. In this preferred embodiment, the laser processing apparatus 1 is used to apply a pulsed laser beam to the semiconductor wafer 10 through the supporting tape T attached to the back side of the semiconductor wafer 10 with the pear-skin surface T1 of the supporting tape T functioning as an incident surface along the crossing division lines L formed on the front side of the semiconductor wafer 10, thereby forming the modified layers in the semiconductor wafer 10 along the division lines L. In this preferred embodiment, the laser processing apparatus 1 has an integral configuration including a coating apparatus 100 for applying a coating member of liquid resin to the pear-skin surface T1 of the supporting tape T attached to the back side of the semiconductor wafer 10 prior to laser processing to thereby planarize the pear-skin surface T1 of the supporting tape T.
(Coating Apparatus)

Figure 3:
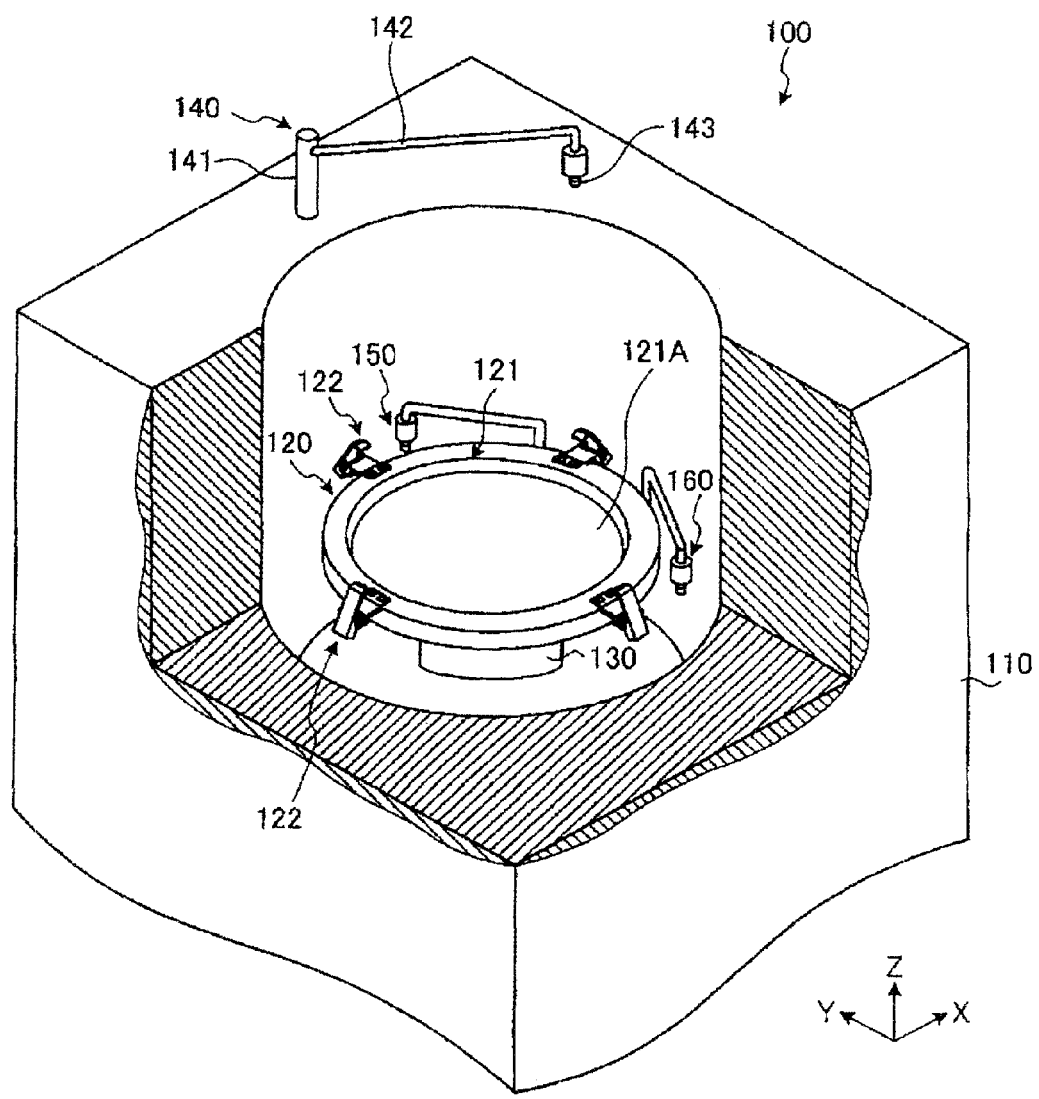
FIG. 3 is a perspective view for illustrating a retracted position of a holding table constituting a coating apparatus.

The configuration of the coating apparatus 100 will now be described. FIG. 3 is a perspective view for illustrating a retracted position of a holding table 120 constituting the coating apparatus 100, wherein a housing 110 is partially cut away to show the inside of the housing 110. As shown in FIGS. 2 and 3, the coating apparatus 100 includes the holding table 120 for holding the semiconductor wafer 10 in the condition where the front side of the semiconductor wafer 10 (where the devices 12 are formed) is oriented downward and coating member supplying means 140 for supplying the coating member to the supporting tape T attached to the back side of the semiconductor wafer 10 held by the holding table 120.

The holding table 120 primarily includes a chuck table having a size corresponding to the size of the semiconductor wafer 10. The holding table 120 has an upper surface as a holding surface 121 for holding the semiconductor wafer 10 thereon and a plurality of clamps 122 provided along the outer circumference of the holding surface 121 for fixing the annular frame F (see FIG. 1). The semiconductor wafer 10 placed on the holding surface 121 is held under suction. Although not shown, a plurality of suction holes opening to the holding surface 121 are connected to suction means. As shown in FIGS. 2 and 3, the holding surface 121 has a projecting peripheral area and a central recessed area surrounded by the projecting peripheral area. Accordingly, the devices 12 formed on the front side of the semiconductor wafer 10 placed on the holding surface 121 are prevented from coming into direct contact with a bottom surface 121A in the central recessed area of the holding surface 121, thereby preventing damage to the devices 12. The semiconductor wafer 10 is carried to the holding table 120 by carrying means (not shown) in the condition where the supporting tape T attached to the back side of the semiconductor wafer 10 is oriented upward. Thus, the semiconductor wafer 10 supported through the supporting tape T to the annular frame F is held under suction on the holding surface 121 of the holding table 120.

The holding table 120 for holding the semiconductor wafer 10 on the holding surface 121 is coaxially provided on the upper end of a cylindrical rotating portion 130. The rotating portion 130 contains a pulse motor (not shown) and is rotatable about a vertical axis extending in the Z-axis direction, so that the holding table 120 is rotatable in a horizontal plane by the rotation of the rotating portion 130. The holding table 120 is supported through the rotating portion 130 so as to be vertically movable in the Z-axis direction by an elevating portion (not shown), so that the holding surface 121 is selectively set in a coating position where the height of the holding surface 121 is the same as that of the upper surface of the housing 110 as shown in FIG. 2 and in a retracted position where the holding surface 121 is lowered from the coating position and retracted in the housing 110 as shown in FIG. 3. The housing 110 is a boxlike member having a cylindrical space for accommodating the vertically movable holding table 120. The rotating portion 130 and the elevating portion (not shown) mentioned above are contained in the housing 110.

As shown in FIG. 3, the coating member supplying means 140 includes a support shaft 141 provided in the vicinity of the upper opening of the cylindrical space of the housing 110 so as to be rotatable about a vertical axis, an arm 142 having one end connected to the upper end of the support shaft 141 and extending horizontally along the upper surface of the housing 110, and a nozzle 143 provided at the other end of the arm 142 so that its nozzle opening is oriented downward. Although not shown, the coating member supplying means 140 further includes a coating member source and a pipe for feeding the coating member from the coating member source to the nozzle 143. In a coating step to be described later, the support shaft 141 is rotated to swing the arm 142 and thereby move the nozzle 143 to a position above the center of the holding surface 121 set in the coating position. In this condition, the coating member is supplied from the nozzle 143 to the pear-skin surface T1 of the supporting tape T attached to the back side of the semiconductor wafer 10 held on the holding surface 121.

The coating apparatus 100 functions also as a cleaning apparatus for cleaning the semiconductor wafer 10 to remove the coating member after laser processing. Accordingly, the coating apparatus 100 further includes a cleaning water nozzle 150 for supplying a cleaning water to the pear-skin surface T1 of the supporting tape T attached to the back side of the semiconductor wafer 10 held on the holding surface 121 set in the retracted position and an air nozzle 160 for supplying air from an air source to the pear-skin surface T1.

(Laser Processing Apparatus)

Referring back to FIG. 2, the laser processing apparatus 1 having the coating apparatus 100 as mentioned above includes a holding table 2 for holding the semiconductor wafer 10, holding table driving means 4 for moving the holding table 2 both in the X-axis direction (feeding direction) and in the Y-axis direction (indexing direction), and laser applying means 5 for applying a pulsed laser beam to the semiconductor wafer 10 held by the holding table 2 from the upper side of the supporting tape T attached to the back side of the semiconductor wafer 10 (more specifically, from the upper side of the coating member formed on the pear-skin surface T1 of the supporting tape T).

Figure 4:
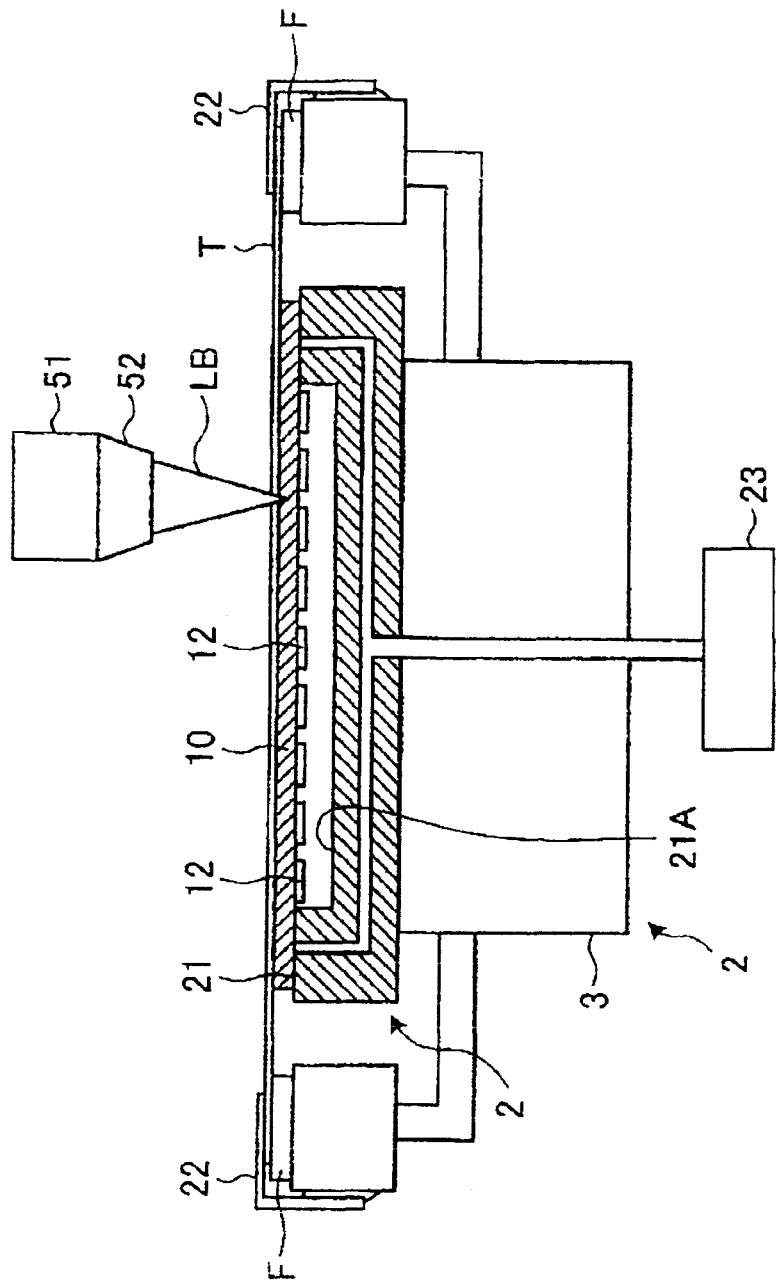
FIG. 4 is a partial sectional view of a holding table for laser processing in the laser processing apparatus.

Like the holding table 120 of the coating apparatus 100, the holding table 2 primarily includes a chuck table having a size corresponding to the size of the semiconductor wafer 10 as shown in FIGS. 2 and 4. The holding table 2 has an upper surface as a holding table 21 for holding the semiconductor wafer 10 thereon and a plurality of clamps 22 provided along the outer circumference of the holding surface 21 for fixing the annular frame F. As shown in FIG. 4, the peripheral portion of the semiconductor wafer 10 placed on the holding surface 21 is held under suction by suction means 23. As shown in FIGS. 2 and 4, the holding surface 21 has a projecting peripheral area and a central recessed area surrounded by the projecting peripheral area. Accordingly, the devices 12 formed on the front side of the semiconductor wafer 10 placed on the holding surface 21 are prevented from coming into direct contact with a bottom surface 21A in the central recessed area of the holding surface 21, thereby preventing damage to the devices 12. The semiconductor wafer 10 is carried to the holding table 2 in the condition where the pear-skin surface T1 of the supporting tape T attached to the back side of the semiconductor wafer 10 is oriented upward (more specifically, the coating member formed on the pear-skin surface T1 is oriented upward). Thus, the semiconductor wafer 10 supported through the supporting tape T to the annular frame F is held under suction on the holding surface 21 of the holding table 2.

The semiconductor wafer 10 is carried to the holding table 2 after the coating member is applied to the pear-skin surface T1 of the supporting tape T attached to the back side of the semiconductor wafer 10 by the coating member 100. As shown in FIG. 2, transportation of the semiconductor wafer 10 between the holding table 120 of the coating apparatus 100 and the holding table 2 of the laser processing apparatus 1 is performed by transporting means 6. The configuration of the transporting means 6 may be the same as that of any transporting means generally used. For example, the transporting means 6 includes a pair of guide rails 61, a ball screw 62 extending parallel to the guide rails 61 so as to be interposed therebetween, a pulse motor 63 for rotationally driving the ball screw 62, a moving block 64 slidably engaged with the guide rails 61 and adapted to be moved between a position above the holding table 120 and a position above the holding table 2 by operating the pulse motor 63, and holding means 65 mounted on the lower end of the moving block 64 for vertically movably holding a plurality of transporting pads 651 for holding the annular frame F under suction. The holding table 2 for holding the semiconductor wafer 10 on the holding surface 21 is provided on the upper end of a cylindrical member 3 so as to be rotatable about a vertical axis by a pulse motor (not shown) provided in the cylindrical member 3.

The holding table driving means 4 includes two sliding blocks 41 and 42 arranged on the upper and lower stages. The holding table 2 is mounted on these two sliding blocks 41 and 42 through the cylindrical member 3. The holding table driving means 4 includes indexing means 43 including a ball screw 431 and a pulse motor 432. The sliding block 41 is movable in the Y-axis direction by the indexing means 43. The indexing means 43 is driven to move the sliding block 41, thereby moving the holding table 2 in the Y-axis direction relative to the laser applying means 5. Thus, the holding table 2 mounted on the sliding block 41 and the laser applying means 5 are relatively moved in the Y-axis direction.

The holding table driving means 4 further includes feeding means 44 including a ball screw 441 and a pulse motor 442. The sliding block 42 is movable in the X-axis direction by the feeding means 44. The feeding means 44 is driven to move the sliding block 42, thereby moving the holding table 2 in the X-axis direction relative to the laser applying means 5. Thus, the holding table 2 mounted on the sliding block 42 and the laser applying means 5 are relatively moved in the X-axis direction.

The indexing means 43 is provided with index amount detecting means 45 for detecting the index amount of the holding table 2. The index amount detecting means 45 includes a linear scale extending in the Y-axis direction and a read head provided on the sliding block 41 for reading the linear scale in moving with the sliding block 41. Similarly, the feeding means 44 is provided with feed amount detecting means 46 for detecting the feed amount of the holding table 2. The feed amount detecting means 46 includes a linear scale extending in the X-axis direction and a read head provided on the sliding block 42 for reading the linear scale in moving with the sliding block 42.

The laser applying means 5 includes a laser applying unit 51 and a supporting member 53 for supporting the laser applying unit 51 above the holding table 2. The laser applying unit 51 functions to apply a pulsed laser beam to the semiconductor wafer 10 held on the holding surface 21, thereby forming the modified layers along the division lines L. The laser applying unit 51 includes focusing means 52 opposed to the supporting tape T attached to the back side of the semiconductor wafer 10 held on the holding surface 21 (more specifically, opposed to the coating member formed on the pear-skin surface T1 of the supporting tape T). The focusing means 52 includes a focusing lens for focusing the pulsed laser beam oscillated by pulsed laser oscillating means included in the laser applying unit 51. The pulsed laser oscillating means is provided by a YAG laser oscillator or a YVO4 laser oscillator, for example, and it functions to oscillate a pulsed laser beam having a predetermined transmission wavelength (e.g., 1064 nm) to the semiconductor wafer 10, from the back side of the semiconductor wafer 10 (from the supporting tape T side) positioned below the focusing means 52.

The laser applying unit 51 is supported to the supporting member 53 so as to be movable in the Z-axis direction. Accordingly, the focusing lens built in the focusing means 52 can be moved perpendicularly to the holding surface 21. Thus, the laser applying means 5 is configured so that it can adjust the focal position (vertical position in the Z-axis direction) of the pulsed laser beam focused by the focusing lens.

The laser processing apparatus 1 is provided with control means 7 for controlling the operation of various components of the laser processing apparatus 1 to centrally control the laser processing apparatus 1. The control means 7 is provided by a microcomputer including a memory storing various data required for the operation of the laser processing apparatus 1. That is, the laser processing apparatus 1 performs a holding step, a planarizing step, and a modified layer forming step under the control of the control means 7.

Figure 5:
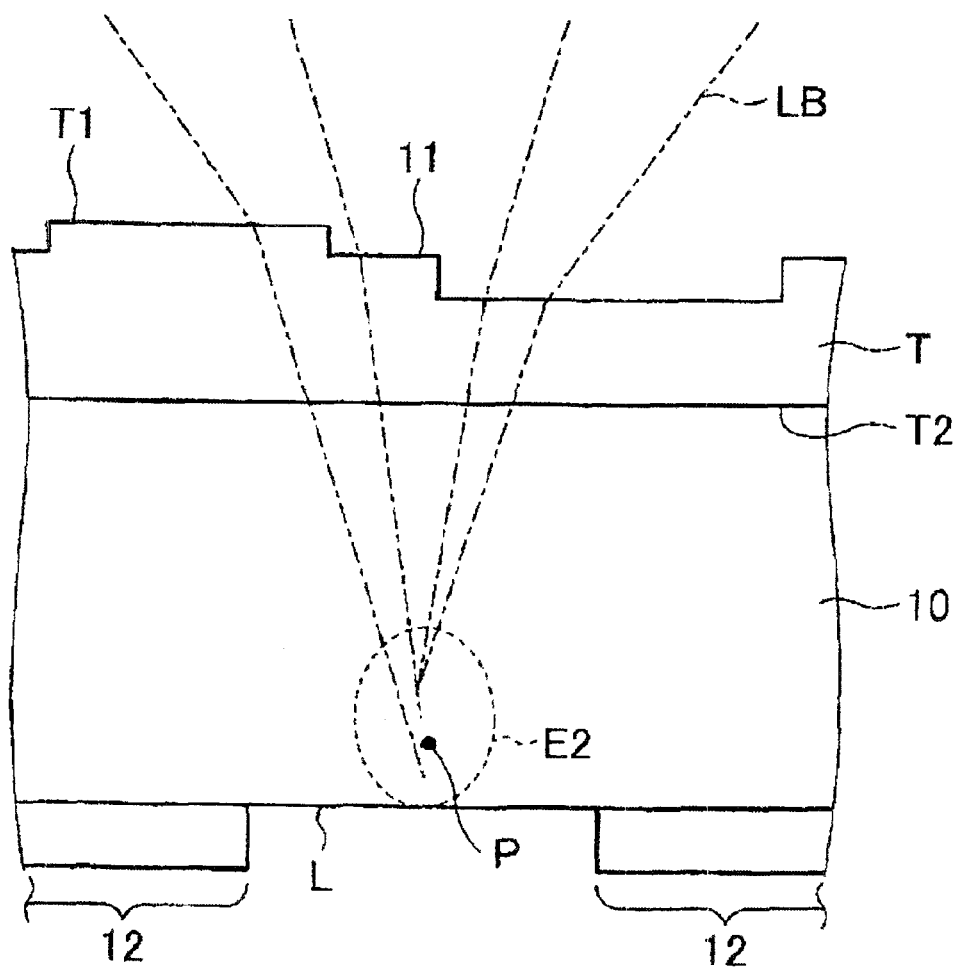
FIG. 5 is an enlarged sectional view showing a focused condition of a laser beam in a comparison.

The laser processing to be performed by the laser processing apparatus 1 in the workpiece dividing method according to this preferred embodiment will now be described as compared with the case where no coating member is provided on the pear-skin surface T1 of the supporting tape T. FIG. 5 is an enlarged cross section for illustrating a comparison, wherein no coating member is provided on the pear-skin surface T1 of the supporting tape T attached to the back side of the semiconductor wafer 10. In FIG. 5, the optical paths of the rays of a pulsed laser beam LB applied to the inside of the semiconductor wafer 10 are shown by single dot & dash lines. In contrast, FIG. 6 is an enlarged cross section for illustrating this preferred embodiment, wherein a coating member 13 is provided on the pear-skin surface T1 of the supporting tape T attached to the back side of the semiconductor wafer 10, thereby planarizing the pear-skin surface T1.

As shown in FIG. 5, the uneven portion 11 is present on the pear-skin surface T1 of the supporting tape T attached to the back side of the semiconductor wafer 10. The refractive indices of air and the supporting tape T for the pulsed laser beam LB are different from each other. Accordingly, when the pulsed laser beam LB is applied to the semiconductor wafer 10 from the supporting tape T side, the optical paths of the rays of the pulsed laser beam LB refract at the interface between air and the supporting tape T. In the case that the pulsed laser beam LB is directly applied to the uneven portion 11 of the supporting tape T as shown in FIG. 5, the pulsed laser beam LB is insufficiently focused as shown in a broken-line area E2 in FIG. 5 because of variations in height of the pear-skin surface T1 in the uneven portion 11.

Figure 6:
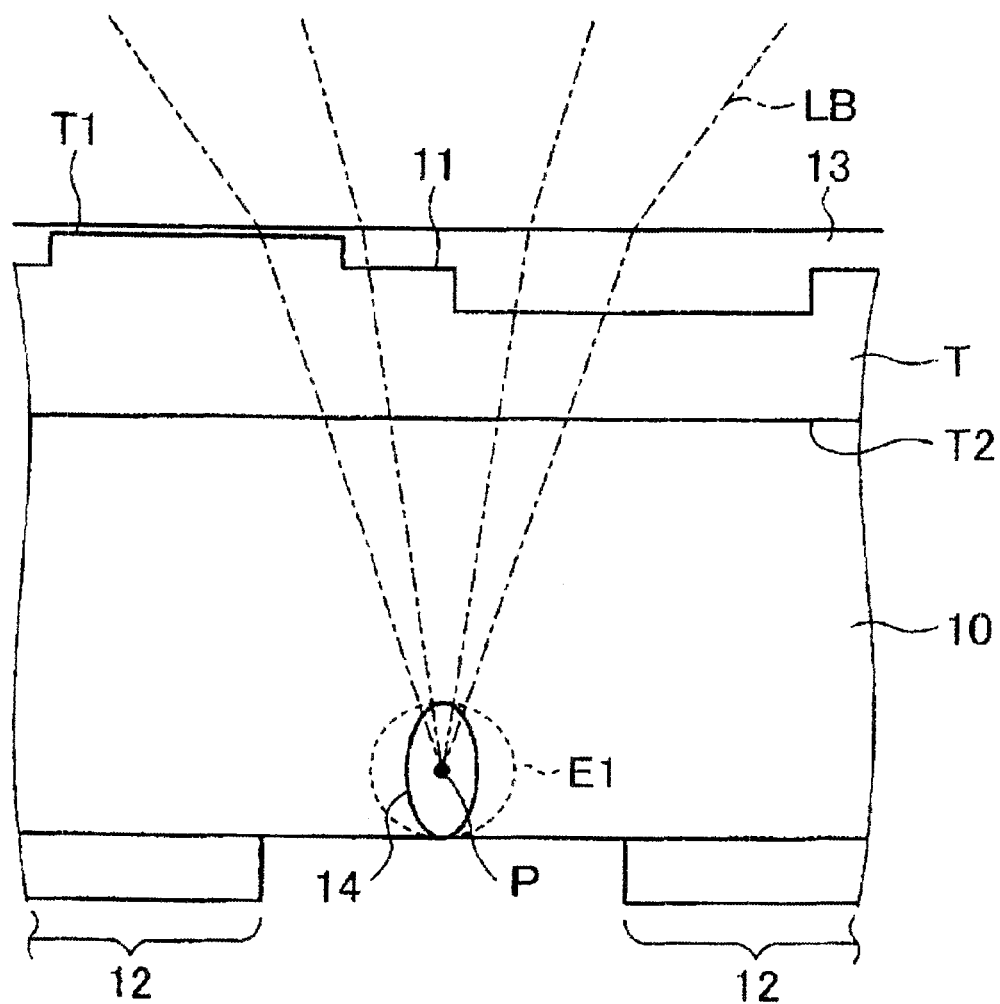
FIG. 6 is an enlarged sectional view showing a focused condition of a laser beam in the preferred embodiment.

To the contrary, in the workpiece dividing method according to this preferred embodiment as shown in FIG. 6, the coating member 13 is applied to the pear-skin surface T1 of the supporting tape T prior to laser processing, thereby planarizing the pear-skin surface T1 (the planarizing step to be described later). The refractive index of the coating member 13 is preferably set to a value close to that of the supporting tape T. That is, a large difference in refractive index between the coating member 13 and the supporting tape T is improper. In this preferred embodiment, the refractive index of the coating member 13 is close to the refractive index of the supporting tape T, so that the degree of refraction of the pulsed laser beam LB at the interface between the pear-skin surface T1 of the supporting tape T and the coating member 13 can be reduced. As a result, the pulsed laser beam LB can be sufficiently focused at a predetermined focal point P as a focal position at a predetermined depth in the semiconductor wafer 10 as shown in a broken-line area E1 in FIG. 6. Accordingly, a modified layer 14 can be reliably formed about the focal point P as shown in FIG. 6.

Specific examples of the coating member 13 include polyimide, optical plastic, and PVA (polyvinyl alcohol) as the liquid resin. The pear-skinerial of the coating member 13 is preferably selected from pear-skinerials whose refractive index for the pulsed laser beam LB is close to the refractive index (about 1.4 to 1.7) of the supporting tape T for the pulsed laser beam LB.

The refractive index of air (0° C., 1 atm pressure) for the pulsed laser beam LB used in laser processing according to this preferred embodiment is about 1.0. Accordingly, by adopting a pear-skinerial having a refractive index of greater than or equal to 1.0 and less than 2.0 as the pear-skinerial of the coating member 13 in consideration of the fact that the refractive index of the supporting tape T is about 1.4 to 1.7, it is considered that the accuracy of laser processing can be improved (it is sufficient that the difference in refractive index for the laser beam used in laser processing between the coating member 13 and the supporting tape T be smaller than the difference in refractive index for this laser beam between air and the supporting tape T). However, when the refractive index of the coating member 13 is closer to the refractive index of the supporting tape T, it is expected that the performance of laser processing can be improved more.

[Workpiece Dividing Method]

There will now be described the specific steps of the workpiece dividing method according to this preferred embodiment. In the workpiece dividing method according to this preferred embodiment, a holding step, a planarizing step, and a modified layer forming step are sequentially performed by the laser processing apparatus 1 mentioned above. Thereafter, a coating member removing step is performed to remove the coating member 13, and a dividing step is next performed to divide the semiconductor wafer 10 as the workpiece along the division lines L (L1 and L2).

(Holding Step)

Prior to the holding step, the holding table 120 in the coating apparatus 100 is set to the coating position by the elevating portion (not shown), and the semiconductor wafer 10 is carried to the holding table 120 by the carrying means (not shown) in the condition where the supporting tape T attached to the back side of the semiconductor wafer 10 is oriented upward, so that the semiconductor wafer 10 is placed on the holding surface 121. In the holding step, the suction means (not shown) for the holding table 120 is driven to hold the semiconductor wafer 10 on the holding surface 121 under suction. Further, the annular frame F supporting the semiconductor wafer 10 through the supporting tape T is fixed by the clamps 122.

(Planarizing Step)

In the next planarizing step, the coating member supplying means 140 is driven to rotate the support shaft 141, thereby swinging the arm 142 to move the nozzle 143 to a position above the center of the holding surface 121. Thereafter, a predetermined amount of liquid resin as the coating member 13 is discharged from the nozzle 143 onto the pear-skin surface T1 of the supporting tape T attached to the back side of the semiconductor wafer 10 held on the holding surface 121. Thereafter, the elevating portion (not shown) is driven to lower the holding table 120 to the retracted position. Thereafter, the rotating portion 130 is driven to rotate the holding table 120 at a predetermined speed for a predetermined time, thereby producing a centrifugal force to spread the liquid resin on the pear-skin surface T1 of the supporting tape T and next cure the liquid resin with the elapse of time, thus obtaining the coating member 13 formed on the pear-skin surface T1 of the supporting tape T. The rotation speed and rotation time of the holding table 120 are suitably set according to the film thickness of the coating member 13. The film thickness of the coating member 13 may also be suitably set. However, it is preferably set to a minimum film thickness required for planarization of the uneven portion 11 of the pear-skin surface T1 of the supporting tape T. In consideration of the degree of steps forming the uneven portion 11 of the pear-skin surface T1 of the supporting tape T commonly used, the film thickness of the coating member 13 is set to preferably 0.5 to 10 μm, more preferably 0.5 to 7 μm, and further more preferably 0.5 to 5 μm. If the film thickness of the coating member 13 is smaller than the above range, the uneven portion 11 cannot be completely planarized, whereas if the film thickness of the coating member 13 is larger than the above range, the resin forming the coating member 13 undesirably absorbs the pulsed laser beam LB in the next modified layer forming step.
(Modified Layer Forming Step)

Prior to the modified layer forming step, the holding table 120 in the coating apparatus 100 is raised to the coating position by the elevating portion (not shown). Thereafter, the transporting means 6 is driven to transport the semiconductor wafer 10 from the holding table 120 to the holding table 2, so that the semiconductor wafer 10 is placed on the holding surface 21 in the condition where the coating member 13 formed on the pear-skin surface T1 of the supporting tape T is oriented upward. In this condition, the annular frame F is fixed by the clamps 22. Further, as shown in FIG. 4, the suction means 23 of the holding table 2 is driven to directly hold the semiconductor wafer 10 on the holding surface 21 under suction. Thereafter, the pulse motor (not shown) provided in the cylindrical member 3 is driven to adjust the orientation of the semiconductor wafer 10 held on the holding surface 21 so that the first division lines L1 of the crossing division lines L extend in the X-axis direction. In the modified layer forming step, the holding table driving means 4 is driven to move the holding table 2 in the X-axis direction and/or the Y-axis direction, thereby positioning one of the first division lines L1 as a target division line directly below the focusing means 52.

Prior to positioning of the target division line L1, it is necessary to detect the division lines L formed on the front side of the semiconductor wafer 10. The semiconductor wafer 10 is held on the holding surface 21 in the condition where the front side of the semiconductor wafer 10 is oriented downward. Accordingly, in the case that the semiconductor wafer 10 is a silicon wafer, an infrared camera (not shown) using infrared light passing through a silicon wafer is used. By using such an infrared camera, infrared light is passed through the semiconductor wafer 10 held on the holding surface 21, thereby imaging the front side of the semiconductor wafer 10 on which the division lines L are formed. Image data obtained by this imaging is subjected to image processing such as pattern pear-skinching to thereby detect the division lines L. In such a case that the division lines L are imaged through the pear-skin surface T1 by using an infrared camera as mentioned above, blurring of the image due to the effect of the pear-skin surface T1 can be suppressed because the pear-skin surface T1 is planarized by the coating member 13. By detecting the division lines L in this manner, the target division line L1 is positioned directly below the focusing means 52. In this case, it is sufficient that the division lines L set on the front side of the semiconductor wafer 10 can be detected. Accordingly, a visible light camera or the like may be suitably used according to the kind of the semiconductor wafer 10.

Thereafter, the supporting member 53 is moved to a predetermined position in the Z-axis direction so that the pulsed laser beam LB is focused at a predetermined depth in the semiconductor wafer 10. Thus, the focal point of the focusing lens in the focusing means 52 is adjusted to the position P (see FIG. 6) at the predetermined depth in the semiconductor wafer 10. Thereafter, the pulsed laser beam LB is applied to the semiconductor wafer 10 by the laser applying unit 51 as feeding the holding table 2 in the X-axis direction. Accordingly, the pulsed laser beam LB is applied along the target division line L1 in the condition where it is focused at the position P of the predetermined depth in the semiconductor wafer 10, thereby forming a modified layer 14 in the semiconductor wafer 10 along the target division line L1.

Thereafter, the remaining first division lines L1 are stepwise positioned directly below the focusing means 52 to similarly apply the pulsed laser beam LB to the semiconductor wafer 10, thereby forming modified layers 14 along the remaining first division lines L1. After thus forming the modified layers 14 along all of the first division lines L1, the holding table 2 is rotated 90° to thereby change the orientation of the semiconductor wafer 10 so that the second division lines L2 extend in the X-axis direction. Thereafter, the second division lines L2 are stepwise positioned directly below the focusing means 52 to similarly apply the pulsed laser beam LB to the semiconductor wafer 10, thereby forming modified layers 14 along the second division lines L2.

Each modified layer mentioned above means a region different from its ambient region in density, refractive index, mechanical strength, or any other physical properties. Examples of each modified layer include a melted region, cracked region, breakdown region, and refractive index changed region. These regions may be present in a mixed condition. By forming the modified layer forming step mentioned above, the modified layers 14 are formed in the semiconductor wafer 10 along the crossing division lines L.
(Coating Member Removing Step)

In the case of using a water-soluble pear-skinerial such as PVA as the coating member 13, the coating member removing step can be performed by the coating apparatus 100 included in the laser processing apparatus 1. As described above, the coating apparatus 100 functions also as a cleaning apparatus. Accordingly, by carrying the semiconductor wafer 10 to the holding table 120 after performing the modified layer forming step, the coating member removing step can be performed by the coating apparatus 100.

In the case of performing the coating member removing step prior to the dividing step as in this preferred embodiment, the semiconductor wafer 10 is placed on the holding surface 121 of the holding table 120 of the coating apparatus 100 in the condition where the coating member 13 is oriented upward. The suction means (not shown) for the holding table 120 is next driven to hold the semiconductor wafer 10 on the holding surface 121 under suction. Further, the annular frame F is fixed by the clamps 122. The elevating portion (not shown) is next driven to lower the holding table 120 to the retracted position. The cleaning water nozzle 150 and the air nozzle 160 are next positioned above the holding surface 121 of the holding table 120 set in the retracted position. Thereafter, the rotating portion 130 is driven to rotate the holding table 120. At the same time, cleaning water and air are respectively discharged from the cleaning water nozzle 150 and the air nozzle 160 toward the supporting tape T. As a result, the pear-skin surface T1 of the supporting tape T is cleaned and the coating member 13 is removed from the pear-skin surface T1. (Dividing step)

In the dividing step subsequent to the coating member removing step, an external force is applied to the semiconductor wafer 10 to divide the semiconductor wafer 10 as starting from the modified layers 14 as a break start point. This dividing step is performed by a dividing apparatus known in the art. The dividing apparatus is so configured as to radially pull the outer circumference of the supporting tape T attached to the back side of the semiconductor wafer 10, thereby expanding the supporting tape T to apply a radial tensile force to the semiconductor wafer 10.

Figure 7:
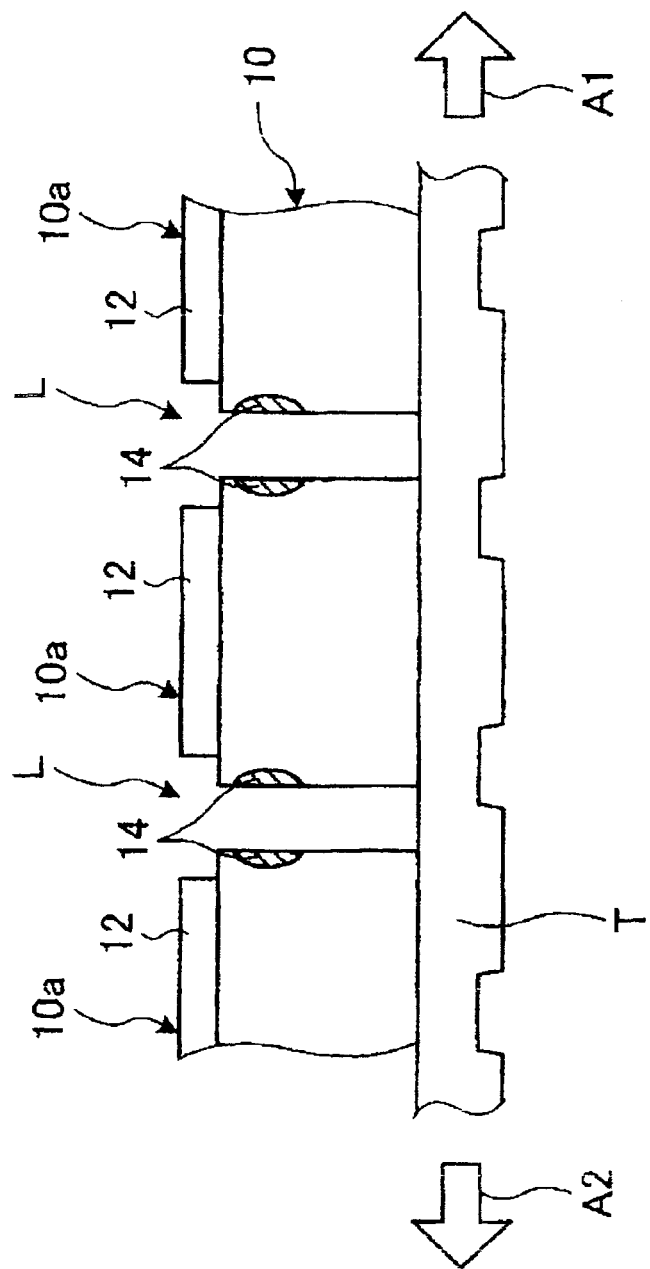
FIG. 7 is a sectional view for illustrating a dividing step in the preferred embodiment.

Prior to the dividing step, the semiconductor wafer 10 having the modified layers 14 is held by a dividing table constituting the dividing apparatus. The dividing table has an upper surface as a holding surface for holding the semiconductor wafer 10 through the supporting tape T attached to the back side of the semiconductor wafer 10. The semiconductor wafer 10 is carried to this dividing table in the condition where the front side of the semiconductor wafer 10 is oriented upward. In the dividing step, the supporting tape T attached to the back side of the semiconductor wafer 10 is expanded as shown by arrows A1 and A2 in FIG. 7 by the dividing apparatus to thereby apply an external force to the semiconductor wafer 10. As a result, the semiconductor wafer 10 is broken along the division lines L where the modified layers 14 are formed to reduce the strength, thus obtaining a plurality of chips 10a as shown in FIG. 7. That is, the semiconductor wafer 10 is divided into a plurality of individual devices. In the dividing step, the pear-skin surface T1 of the supporting tape T is in contact with the holding surface, so that good slidability of the supporting tape T on the holding surface can be ensured. Accordingly, the whole area of the supporting tape T can be expanded to well divide the semiconductor wafer 10.

Example

There will now be described a test carried out by comparing a formed condition of modified layers in the case that the coating member 13 is formed on the pear-skin surface T1 of the supporting tape T and a formed condition of modified layers in the case that the coating member 13 is not formed. In this test, the adhesive surface T2 of the supporting tape T of PVC (polyvinyl chloride) having a thickness of 90 μm was attached to the back side of a silicon wafer W having a thickness of 725 μm. Thereafter, PVA (polyvinyl alcohol) as the liquid resin was applied to the pear-skin surface T1 of the supporting tape T by spin coating to form the coating member 13 having a thickness of 1.0 μm, thus preparing a sample 1. In comparison, the coating member 13 was not formed on the pear-skin surface T1 of the supporting tape T to prepare a sample 2. By using these samples 1 and 2, a pulsed laser beam was applied through the supporting tape T to the silicon wafer W to examine the forpear-skinion of modified layers. The pulsed laser beam was applied along one division line plural times with the focal position changed along the depth of the silicon wafer W.

Figure 8:
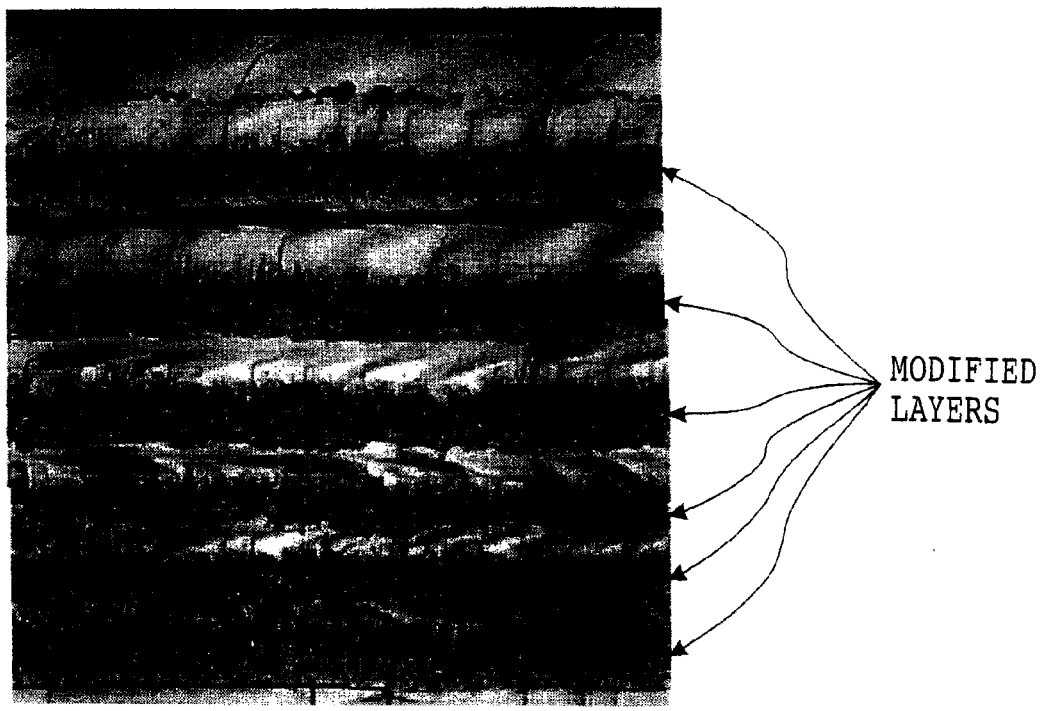
FIG. 8 is a view showing a sectional image of a laser-processed area in a workpiece as a sample 1 in a test, wherein a coating member is formed on a supporting tape attached to the workpiece.
Figure 9:
FIG. 9 is a view similar to FIG. 8, showing a sample 2, wherein the coating member is not formed on the supporting tape.

The results of this test are shown in FIGS. 8 and 9. FIG. 8 shows the sample 1, wherein the pear-skin surface T1 of the supporting tape T was planarized by the coating member 13 and a plurality of modified layers were therefore confirmed in the silicon wafer W. FIG. 9 shows the sample 2, wherein the coating member 13 was not provided and almost no modified layers were therefore confirmed in the silicon wafer W. Thus, it was confirmed that by forming the coating member 13 on the pear-skin surface T1 of the supporting tape T by spin coating to thereby planarize the pear-skin surface T1, the modified layers can be well formed in the silicon wafer W by the pulsed laser beam passed through the supporting tape T.

According to this preferred embodiment as described above, the coating member 13 having a refractive index close to that of the supporting tape T for the pulsed laser beam LB is formed on the pear-skin surface T1 of the supporting tape T to thereby planarize the pear-skin surface T1. The pulsed laser beam LB is applied from the upper side of the planarized pear-skin surface T1 (i.e., the upper side of the coating member 13) to the inside of the semiconductor wafer 10, thereby forming the modified layers 14 in the semiconductor wafer 10 along the division lines L. Accordingly, the pulsed laser beam LB can be sufficiently focused at the point P in the semiconductor wafer 10 to thereby well form the modified layers 14 in the semiconductor wafer 10, so that the semiconductor wafer 10 can be well divided along the modified layers 14 as a break start point.

In the above preferred embodiment, the holding surface 121 of the holding table 120 and the holding surface 21 of the holding table 2 are recessed at their central portions to protect the devices 12 formed on the front side of the semiconductor wafer 10. As a modification, a porous sheet may be interposed between the front side of a workpiece and a flat holding surface of a normal holding table to protect the devices 12. As another modification, a protective tape attached to the front side of a workpiece in back grinding may be maintained and the workpiece may be held on the table through the protective tape to protect the devices 12. However, the front side of the workpiece on which the devices 12 are formed may be directly held on a normal holding table unless there occurs a problem.

As described above, the workpiece dividing method according to the present invention is suitable in dividing a workpiece after performing laser processing to form the modified layers in the workpiece even when a supporting tape having an uneven portion as an incident surface for a pulsed laser beam is attached to the workpiece.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A workpiece dividing method for dividing a workpiece having a plurality of division lines formed on a front side of said workpiece for partitioning a plurality of regions where a plurality of devices are respectively formed, wherein an adhesive tape having an adhesive surface and a pear-skin surface opposite the adhesive surface as an exposed surface is attached to the back side of said workpiece on said adhesive surface, said workpiece dividing method comprising:

a planarizing step of applying a liquid resin to said exposed surface of said adhesive tape and then curing said liquid resin to thereby planarize said exposed surface of said adhesive tape;

a modified layer forming step of applying a laser beam having a transmission wavelength to said cured resin, said adhesive tape, and said workpiece from the side of said exposed surface of said adhesive tape to said workpiece in the condition where the focal point of said laser beam is set at a predetermined depth in said workpiece after performing said planarizing step, thereby forming a plurality of modified layers in said workpiece along said division lines; and a dividing step of applying an external force to said workpiece after performing said modified layer forming step, thereby dividing said workpiece along said division lines as starting from said modified layers formed in said workpiece as a break start point.

2. The workpiece dividing method as described in claim 1 further comprising:

a removing step of removing the cured resin from the exposed surface of said adhesive tape prior to said dividing step.

* * * * *